United States Patent
Biscarini et al.

(10) Patent No.: US 7,534,468 B2
(45) Date of Patent: May 19, 2009

(54) PROCESS FOR OBTAINING SPATIALLY-ORGANISED NANOSTRUCTURES ON THIN FILMS

(75) Inventors: Fabio Biscarini, Bologna (IT);
Massimiliano Cavallini, Vergato (IT);
David A. Leigh, Edinburgh (GB);
Francesco Zerbetto, Bologna (IT)

(73) Assignee: Scriba Nanotechnologie S.R.L., Bologna (IT)

( * ) Notice: Subject to any disclaimer, the term of this patent is extended or adjusted under 35 U.S.C. 154(b) by 259 days.

(21) Appl. No.: 10/537,158

(22) PCT Filed: Dec. 2, 2003

(86) PCT No.: PCT/EP03/13594

§ 371 (c)(1),
(2), (4) Date: May 31, 2005

(87) PCT Pub. No.: WO2004/051709

PCT Pub. Date: Jun. 17, 2004

(65) Prior Publication Data

US 2006/0019439 A1    Jan. 26, 2006

(30) Foreign Application Priority Data

Dec. 4, 2002    (IT)    .......................... BO2002A0759

(51) Int. Cl.
*C23C 16/00*    (2006.01)
(52) U.S. Cl. .................................... 427/248.1; 977/840
(58) Field of Classification Search ............. 427/248.1; 369/126; 977/700, 840, 849–879
See application file for complete search history.

(56) References Cited

U.S. PATENT DOCUMENTS

| 5,835,477 | A | 11/1998 | Rohrer et al. |
| 6,324,091 | B1 | 11/2001 | Clausen et al. |
| 6,459,095 | B1 | 10/2002 | Heath et al. |
| 6,827,979 | B2 * | 12/2004 | Mirkin et al. ............... 427/256 |
| 2002/0172072 | A1 | 11/2002 | Walmsley et al. |

OTHER PUBLICATIONS

Cavallini et al., "Information Storgae Using Supramolecular Surface Patterns", Jan. 24, 2003, Science Magazine, vol. 299, p. 531.*

Cavallini et al., "Conformational Self-Recognition as the Origin of Dewetting in Bistable Molecular Surfaces", Oct. 11, 2001, American Chemical Society, J. Phys. Chem. B 2001, 105, 10826-10830.*

Michel et al. "Printing meets lithography: Soft approaches to high-resolution patterning", Sep. 5, 2001, IBM, J. Res. Dev., vol. 45, p. 697-719.*

(Continued)

*Primary Examiner*—Timothy Meeks
*Assistant Examiner*—Elizabeth Burkhart
(74) *Attorney, Agent, or Firm*—Modiano & Associati; Daniel J. O'Byrne (57) ABSTRACT

A process for forming nanostructures comprising the step of applying on localised regions of a smooth thin film of bistable or multistable molecules an external perturbation with preset magnitude thereby said film undergoes a collective morphological transformation and nanostructures are formed by selforganisation of said molecules, said nanostructures having preset number, size, interspacing and shape. The nanostructures can be used as storage medium in storage devices.

16 Claims, 7 Drawing Sheets
(2 of 7 Drawing Sheet(s) Filed in Color)

OTHER PUBLICATIONS

Cavallini M et al: "Spontaneous fabrication of microscopic arrays of molecular structures with submicron length scales" Nano Letters, Jun. 2002, American Chem. Soc, USA, vol. 2, No. 6, pp. 635-639, XP002280376 ISSN: 1530-6984 the whole document figures 1-3.

Vettiger P et al: "The Millipede-more than one thousand tips for future AFM data storage" IBM Journal of Research and Development, IBM Corporation, Armonk, US, vol. 44, No. 3, May 2000, pp. 323-340, XP002194187 ISSN: 0018-8646 figures 1-3.

Moore Jeffrey S: "Supramolecular Polymers" Current Opinion in Colloid & Interface Science, vol. 4, 1999, pp. 108-116, XP002280377 the whole document.

* cited by examiner

PROCESS FOR OBTAINING SPATIALLY-ORGANISED NANOSTRUCTURES ON THIN FILMS

The present invention regards a process for forming nanostructures that are spatially organised and with controlled size. The process is scalable, and is particularly useful for writing and storing information at ultra-high density and large writing rate by forming of strings of nanometer-sized dots or strips starting from a smooth organic thin film.

BACKGROUND OF THE INVENTION

Innovative technologies for information storage are aiming to reach the terabit limit, viz. to write more than a trillion bits on an inch squared. The magnetic hard disk drive (HDD) is today's most widely used mass data storage technique. Densest magnetic storage has been demonstrated recently to have reached an areal density of 100 Gbits per square inch (Gbpsi), using perpendicular recording technology. [1] State-of-the-art industrial production fabricates devices with areal density on the order of 50 Gbpsi. Although the annual rate of increase in the areal density of HDD is 60-100%, it is believed, although not proven yet, that the magnetic technology should break down beyond the 200 Gbpsi limit because of uncertainty in the read/write areal density due to superparamagnetic current effects.

Alternative techniques for mass data storage [2,3,4] have been pursued, whose potential is to write information at terabit density, and with a power dissipation comparable to magnetic storage writing. Scanning probe microscopies (SPM) have been demonstrated already more than a decade ago as useful writing/reading tools. [5] For instance, bits can be represented in the form of topographic indentations or protrusions on a flat surface. The unparalleled resolution, both horizontal and vertical, allows SPM to write 1 bit per square nm, which implies an areal density of 600 Terabit per square inch.

This density is however accessible only on perfect crystal surfaces in ultra-high vacuum, which are of no straightforward technological use. Moreover, a single probe SPM is excessively slow, with best data rates demonstrated of 100 kbit/s in writing, and 1-10 Mbit/s for reading. [6,7,8]

A parallel data storage system based on SPM has been developed in the last decade by researchers at IBM Zürich [9,10]. It is a thermomechanical process operated by an array of cantilevers, termed "millipede", each of them carrying an independent resistive probe [11]. The resistor can be heated upon applying a suitable voltage, and an individual "bit" can be written as an indentation of the hot tip in a thermoplastic polymeric film. The read out process is based on measuring the heat loss from the tip to the substrate, which is lesser when the tip is above an indentation. Local heating erases the indentation, so the technology is re-writable. By rastering the polymer film below the array of cantilevers, information can be written and read on a large area, at a data rate which is proportional to the number of cantilevers, but is inversely proportional to indentation time and limited by rastering speed. On these basis, the millipede system could support data rates as high as 1-2-Megabits per second. Power consumption is small (100 mW), due to the small displacements of the storage medium with respect to the millipede. This is compatible with flash memory technology and considerably below magnetic recording. A millipede with 1024 cantilevers was fabricated, and a terabit density demonstrated. [12] The millipede technology has also some drawbacks: i) each tip can only write bits one by one; 2) a percentage of non-working levers leaves un-written areas; iii) the film must be sufficiently smooth to let the passive system of cantilevers to operate without individual adjustements of the tips above the surface.

Other processes based on SPM allow one to write information in the form of dots, rather than indentations. Among the highest areal densities achieved, local oxidation of a substrate by scanning force microscopy [13] has demonstrated the highest areal density with dots 1 nm high, 20-40 nm wide and less than 20 nm apart. However, the dots cannot be erased and re-writing is not possible. This approach can be upscaled to paralell writing by using a multiple source of conductive protrusions, either a "millipede" with conductive tips, or a metallic or metal coated stamp. [14,15]

Novel strategies for information storage technology rely upon multistability. Multistable systems can be controllably switched between different configurations of comparable free energy. Multistability is intrinsically present in molecular and supramolecular systems through a variety of properties (conformations, co-conformations, redox and spin states, shape and dimensionality) which can be influenced by external stimuli (such as mechanical, electric, thermal, light). However, most of these changes manifest themselves only over length scales of, at best, a few molecules and in solution.

SUMMARY OF THE INVENTION

An aim of the present invention is to provide a process for obtaining nanopatterning of soft matter and thin films, for information storage at ultra-high density, and for other applications where spatially-controlled nanostructure are useful.

Another aim of the present invention is to provide a process that makes possible to generate, simultaneously, an arbitrary number of dots, from 1 to as many dots are desired, organised into strings along well-defined lines on a thin film deposited on a substrate, the dots having the same size and being periodically spaced.

Still another aim of the present invention is that of providing a process for forming nanostructures that is scalable and allows to obtain high areal density of dots.

A further aim of the present invention is to provide a process that allows to controllably switch multistable systems between different configurations of comparable free energy, particularly allowing to affect a variety of properties of a molecular and supramolecular system, such as conformation, co-conformations, redox and spin states, shape and dimensionality, by changes occuring in the solid state, and their effect i being amplified across multiple length scales in terms of a morphological change that allows one to read and address them.

Another aim of the present invention is to provide a process useful for writing and storing information at ultra-high density and large writing rate by forming of strings of nanometer-sized dots or strips starting from a smooth organic thin film.

These and other aims of the present invention, that are detailed in the following description, are reached by a process for forming nanostructures comprising the step of applying on localised regions of a smooth thin film of bistable or multistable molecules an external perturbation with preset energy thereby said film undergoes a collective morphological transformation and nanostructures are formed by selforganisation of said molecules, said nanostructures having preset number, size, interspacing and shape.

The formed nanostructures can be in the form of dots, when said regions are one-dimensional and said nanostructures are in the form of strips, when said regions are two-dimensional.

The dots can be formed with a density, inter-dot distance or pitch and size controlled by presetting the thickness of said thin film.

The dots can be formed in a number controlled by presetting a length of said regions.

The nanostructures can also be organised in the form of arrays of nanostructures.

The dots can formed with the process of the present invention with areal densities of 1-1000 Gbpsi and can be used to code information.

The perturbation used in the present invention can be selected from a mechanical perturbation, a thermal perturbation, a thermo-mechanical perturbation, an electrical perturbation, a magnetic perturbation, a perturbation made with light or combinations thereof.

Moreover, the perturbation used in the present invention can be applied with a scanning probe microscope (SPM), or with mechanical devices, millipedes or actuators able to produce multiple local perturbations.

The perturbation can also be applied with a rigid stamp or with a flexible stamp with which a load force is applied on said film regions. The load force used can be preset, depending on the nature of the film, in the range of 0.1 to 100 kg/cm2.

The perturbation can also be constituted by a monochromatic light shone through the objective of an optical microscope, including a scanning confocal or scanning near-field optical microscopes. This can also be done with photolithography setups.

The morphological transformation of the thin film involves a variety of phenomena that introduce spatial correlations and, at the same time, remain localised to the region of the thin film where the perturbation acts. Examples are wetting/dewetting transitions by nucleation of holes or droplets, spinodal dewetting, spinodal decomposition, crystallisation or formation of intermediate metastable structures.

The molecules of the thin film used in the present invention can be selected from the group consisting of rotaxanes also endowed with optically or electrically active groups.

The molecules can also be selected from the class of catenanes and from molecules having an isomerizable double bond, particularly molecules containing a linear C=C bond exhibiting a cis-trans isomerisation, azo e diazo groups.

The molecules can further be selected from molecular motors and actuators and biological motors, particularly actine, miosine, oligopeptides, DNA, RNA and oligonucleotides.

The thin film used in the present invention can be deposited on a substrate or grown on a substrate form solution, or from vapour phase, or from reactive precursors, or by sublimation.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3a shows an array of nanostructures.

FIG. 3b shows parallel lines of different fabricated length that yielded different number of dots.

FIG. 3c shows the application of the process on a 30×30 square micrometer, with 31 lines consisting of 45 dots each.

FIG. 3d shows an application of the process for dot writing to the storage of hexadecimal numbers in the form of parallel strings.

DESCRIPTION OF THE PREFERRED EMBODIMENTS

The present invention regards a new process that allows the formation of nanostructures by self-organization of bistable molecules, starting from an initially smooth and featureless thin film. The nanostructures are formed only when a local external perturbation, of well defined intensity, is applied. The nanostructures can be controlled and preset in number, size, distance, form. Such nanostructures with the said characteristics can be used to store information or other usages that will become clear in the following.

Storage information media can be obtained with the process of the present invention by obtaining of a thin film of bistable molecules, preferably taken from the class of rotaxanes. Rotaxanes consist of a molecular macrocycle locked around a molecular thread, that has two bulky groups, the stoppers, at both ends to prevent the macrocycle from slipping off the thread.

Figure 1:
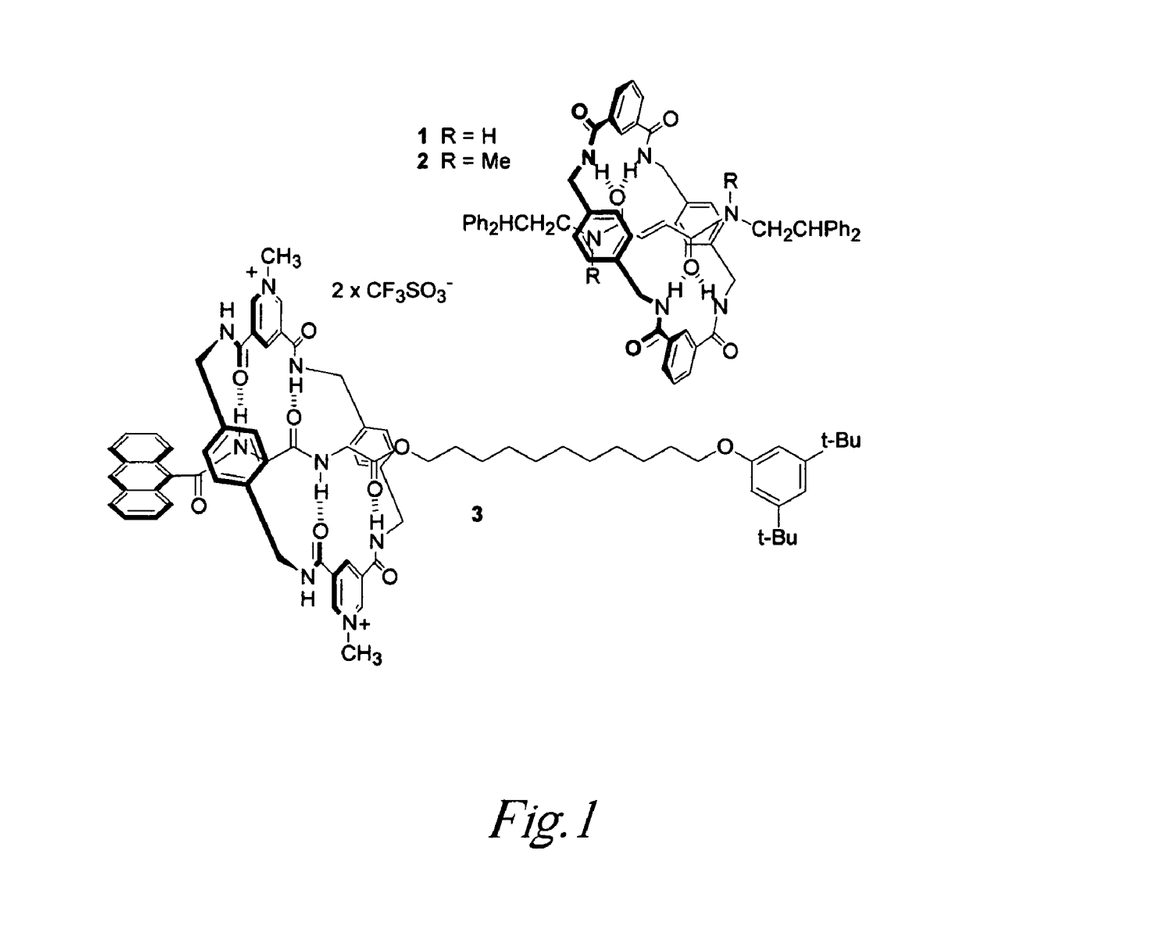
FIG. 1 shows examples of rotaxanes used to demonstrate the process.

Examples of rotaxanes used to demonstrate the process are illustrated in the scheme FIG. 1. Their synthesis has been described in several publications [16]. Several studies, mostly in solution, have demonstrated multi-stability of different co-conformations (viz. the position or orientation of the macrocycle with respect to the thread) for this class of molecules. The rotaxane architecture reminds then a gear around a shaft, else a molecular abacus. This has inspired the possibility of using them as molecular machines and logical switches for ultra-small device applications. By controlling rotaxane switching in the solid state would be a powerful information storage method, provided one can amplify its effects to larger length scales. Other molecules with similar characteristics are catenanes formed by two interlocked macrocycles.

Other molecules that exhibit a similar behaviour are taken from the class of calixarenes and molecular cages; proteins and oligopeptides, such as miosine and actine; DNA, RNA, and oligonucleotides; linear systems containing an isomerizable double carbon bond, else an azo- or diazo-group, like stilbene, azostilbene, and diazostilbene.

In one embodiment, the present invention concerns a process that allows to form nanostructures on a thin film made of rotaxanes. An important feature of the process is that nanostructures are formed collectively, and not individually, because of a spatially-controlled self-organisation process, where the molecules themselves move to form the nanostructures of preset size and shape, and at the proper distances with preset regularity, only when a local perturbation of well defined magnitude is applied. The perturbation does not control size and distances, that are preset by the film thickness only.

If the perturbation acts on a rectangular area of the thin film, then regularly spaced, equal parallel lines are obtained. If the perturbation acts along a line, nano-sized dots are formed along the same line. Thus, similarly to what is normally done in CD or DVD architectures, where information is coded as alveoli along "lines" in the different sectors, the dots can be used as "bits" to store information on the thin film. As an example, a 3-nm thick film allows information storage with an areal density close to 100 Gbpsi. We demonstrate that is possible to trigger this transformation mechanically, using either a local probe, viz. the tip of an atomic force microscope (AFM), or, alternatively the force applied by linear protrusions of a stamp. It is important to remark that all nanostructures are formed simultaneously by the collective transformation in the region that is mechanically perturbed: this is completely different from all other local-probe based lithographies, where the writing of the dots or indentations is made one-by-one.

The local perturbation provides the necessary energy to undergo the morphological transformation only in the region where the perturbation acts, leaving the regions outside completely unchanged. The size and spacing of the nanostructures depend on the film thickness, and hence is independent to a large extent on the source of the perturbation. The steady-state of the transformation is reached independently on the detailed parameters of the applied perturbation, apart for the total power dissipated during the mechanical interaction. Although the limitations in data rate of the process demonstrated with the AFM tip are typical of SPM-based lithography, the writing can be upscaled to parallel approaches where a millipede or, more simply, a stamp can be used as a multiple sources of mechanical perturbation.

We demonstrate the scalability of the process by using a stamp whose motif consists of a series of parallel lines.

The writing process is scalable in terms of velocity, of area and data throughput, and density. The dots can be erased by heating the whole substrate, and, presumably, by applying a local heating using resistive protrusions. Thus, the process is viable for writing erasable information, else in non-volatile memories, or in recordable disks. We finally add that this process is not exclusive to the family of rotaxanes or catenanes, but can be engineered by matching several conditions of thin-film/substrate surface energy and surface diffusivity of the adsorbate the thin film is made of.

This process can be used to write non-volatile memories or recordable disks with a density at least 10 times larger than the state-of-the art DVD technology. Other strength of our invention is the low-cost of rotaxanes and molecular materials, the simplicity of the process of film casting and writing, and the scalability of the density, that requires films progressively thinner.

Thus, the invention complies to many criteria of sustainability.

In an embodiment, the present invention involves a smooth, featureless thin film of rotaxanes deposited or grown onto substrate. A local perturbation, mechanical in nature, is applied. The effect of such perturbation is to provide energy onto spatially defined regions of the thin film. We take, as an example, the case of a mechanical perturbation that is applied locally using the tip of an atomic force microscope (AFM). The perturbation consists in scanning the tip in contact with the thin film with a preset load force several times. Below a threshold value of the force, the mechanical perturbation has no apparent effect on the region where it acts.

Above the threshold, the film is irreversibly damaged by the perturbation, as the tip scratches and plows the film with massive displacement of material. At the threshold, or around it in a very small range, the perturbation results in a morphological change in the perturbed region, from a smooth film to a structured film with nanostructures of defined size and characteristic distance. When the perturbation acts on a two-dimensional area, viz the ti is scanning on the xy plane, the nanostructures consist of parallel stripes or strings, with the same width, length, size, and orientation.

Conversely, when the perturbation acts along a line, viz. the tip scans along a single line, the morphology change consists in the appearance of a string of dots. The evolution of the process can be visualised on an oscilloscope, by monitoring the time-evolution of the error signal, else the topography signal, as the tip scans. It can be observed that upon an initial roughening along the scanned line, the dots emerge collectively, their size grows in time and their centers of mass arrange at the proper distances by self-organisation. No correlation either with the scan rate or other scan parameters was found. Once the steady-state is reached, continuing scanning does not yield any further change. The dots are characterised by defined size and spacing, that we demonstrate are controlled by the film thickness. In this respect, the process bears resemblance to spinodal dewetting, although its time- and thickness scaling differ. As the film thickness is preset on the region where the perturbation acts, the density is fixed, and the number of dots can be governed or preset simply by choosing the length of the line where the perturbation acts.

The process is demonstrated on rotaxane thin films grown on a variety of substrates: highly oriented pyrolitic graphite, silicon oxide bare or with primers, glass, metallic thin films, polymers, mica, indium tin oxide (ITO), perovskite films (e.g. manganites). The film is deposited by drop or spin casting from a solution, and post-thermal annealed; it can also be deposited by vapour deposition, by sublimation in vacuum or high-and ultra-high vacuum, CVD, plasma, self-assembling, Langmuir-Blodgett and Langmuir-Shaeffer techniques.

The process is demonstrated for thin films whose thickness was in the 3-35 nm, but can still be valid for thicknesses of 1 monolayer or sub-monolayer, and thicknesses larger than 50 nm. No evidence of a breakdown of the phenomenon was ever observed. Suitable thin films were casted from solution. They exhibit a smooth (<2 nm r.m.s. roughness), homogeneous coverage over a $cm^2$ area. In the case of rotaxanes, they are stable at ambient conditions in air, at room temperature, and ambient relative humidity ($\geq 50\%$) and upon exposure to light. Films show no sign of degradation or change with respect to the as-grown film to AFM investigation after six months. Other deposition techniques or substrates can be used for the same purpose, provided the film quality and thickness are similar.

DESCRIPTION OF THE DYNAMICAL PROCESS

The films can be imaged using Atomic Force Microscopy in contact mode without any significant damage or wear for several times, if the set point force is kept below a threshold value, typically, of about 2 nN. This threshold value depends on the type of tip or protrusion utilised, and from the presence of contamination or overlayer. It also depends upon the specific material forming the thin film. Therefore, this condition may be, in principle, changed from material to material. However, the threshold force can be phenomenologically discovered in a few attempts by systematically changing the setpoint force during scan and looking at instabilities appearing on the oscilloscope, as described before.

Figure 2:
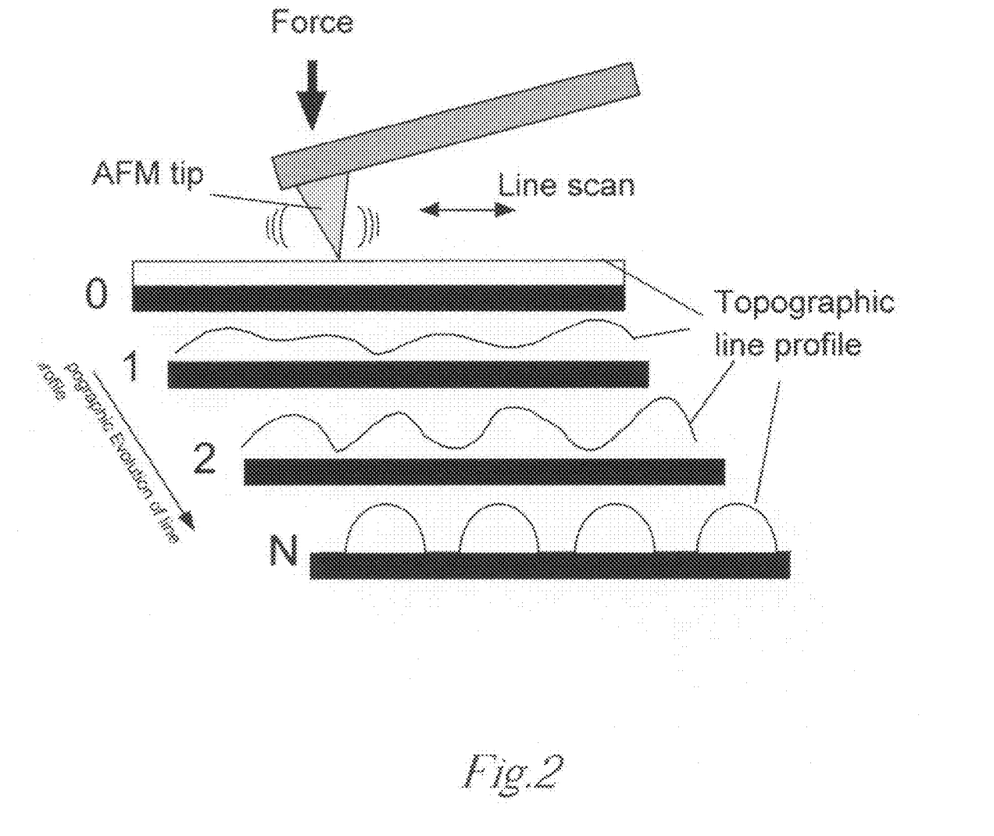
FIG. 2 shows a schematic illustration of the dynamical process of the present invention

Increase of the load force just above the threshold results in a mechanical perturbation whose effect is localized to the contact area of the tip. When the tip is continuously scanned along a line, a string of regularly spaced dots is formed. This process is schematically illustrated in FIG. 2.

The dots emerge upon repeating the linescan a number of times. For silicon nitride tips the number of scans to reach a steady-state arrangement of dots is between 4 and 20, depending on the scan rate (typically 1-2 Hz). Usually, at the same scan rate, longer lines require more scans in order to reach a steady string of dots. This implies that the total dwelling time of the perturbation, on the order of tens of µs, is the relevant parameter for the transformation to occur. Optimised conditions allow us to obtain the structure even in one or two scans. Once the transformation is completed, further scans of the tip along the line do not result in any further change of the dots. The phenomenological law that relates the number of scans, n, to the scanning speed v expressed in Hz reads: const=nv. This holds for a pristine silicon nitride AFM tip when the load force has the value of the threshold force. By increasing the load force above the threshold the film is irreversibly damaged by massive displacement of the material.

Figure 3:
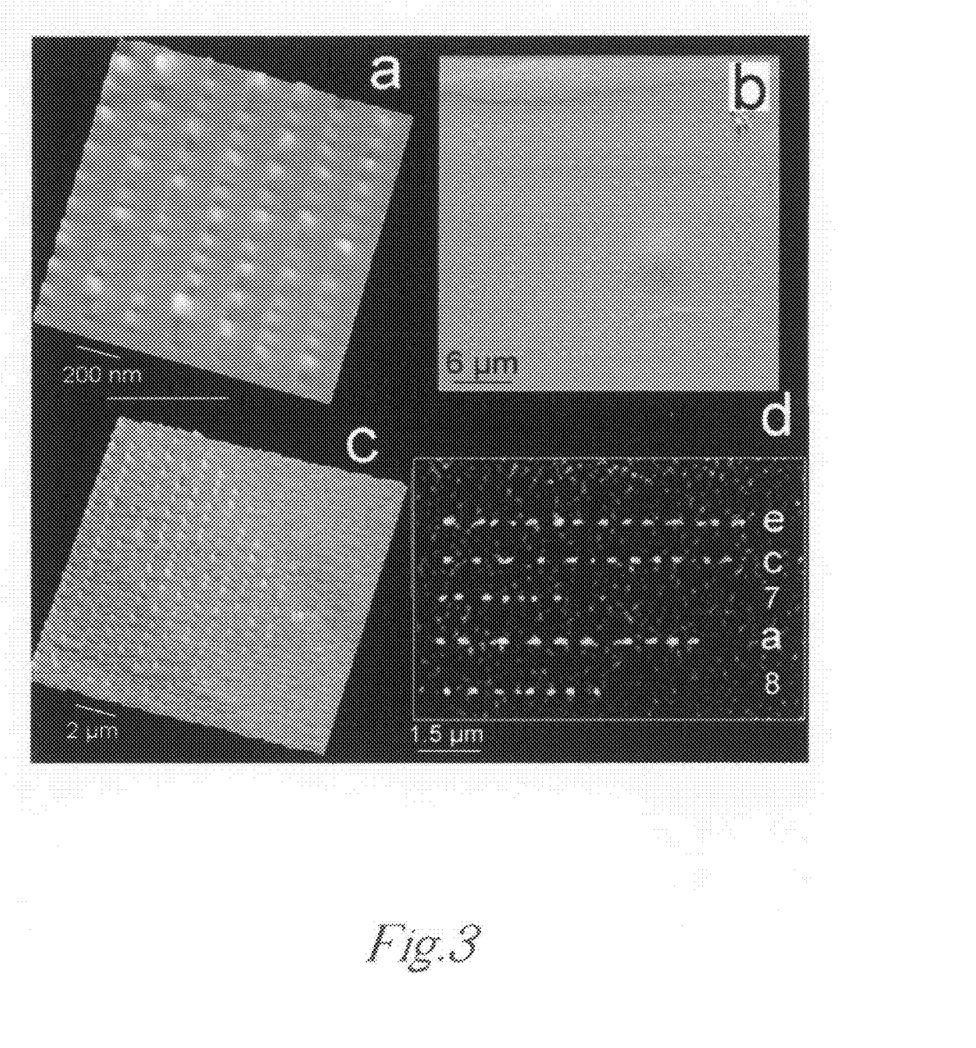
FIG. 3 shows examples of dot writing on the surface of thin films of rotaxane 1 in FIG. 1, on graphite substrate.

In FIG. 3 some examples of dot writing on the surface of thin films made of the rotaxane 1 in FIG. 1, on a graphite substrate.

FIG. 3a shows an array of nanostructures 35-45 nm wide and arranged on a square lattice whose pitch is 140 nm along each line. This array was fabricated on a 5 nm thick film by scanning near the threshold force along parallel lines. Scanning a series of lines results in a regular array of dots of uniform width, height and pitch.

FIG. 3b shows parallel lines of different fabricated length that yielded different number of dots. This demonstrates that the number of dots formed is proportional to the length of each linescan, so that any predetermined number of dots can be reliably fabricated in the region where the perturbation acts, once the thickness is fixed.

FIG. 3c shows the application of the process on a 30×30 µm², with 31 lines consisting of 45 dots each. The image also shows that the presence of typical defects, such as terraces on the graphite plane, do not hinder or prevent the process. In the case shown here, the area is simply limited by the maximum scan range of our piezoelectric actuator in our AFM. This shows the large-area potential of our invention that would allow, for instance, to use optical methods to locate the written region, provided a proper chromophore is inserted in the rotaxane structure.

FIG. 3d shows the proof of concept of an application of the process of dot writing to the storage of hexadecimal numbers in the form of parallel strings, as in an abacus. The sequence: "e c 7 a 8" in the hexadecimal base corresponds to the number "968616".

Figure 4:
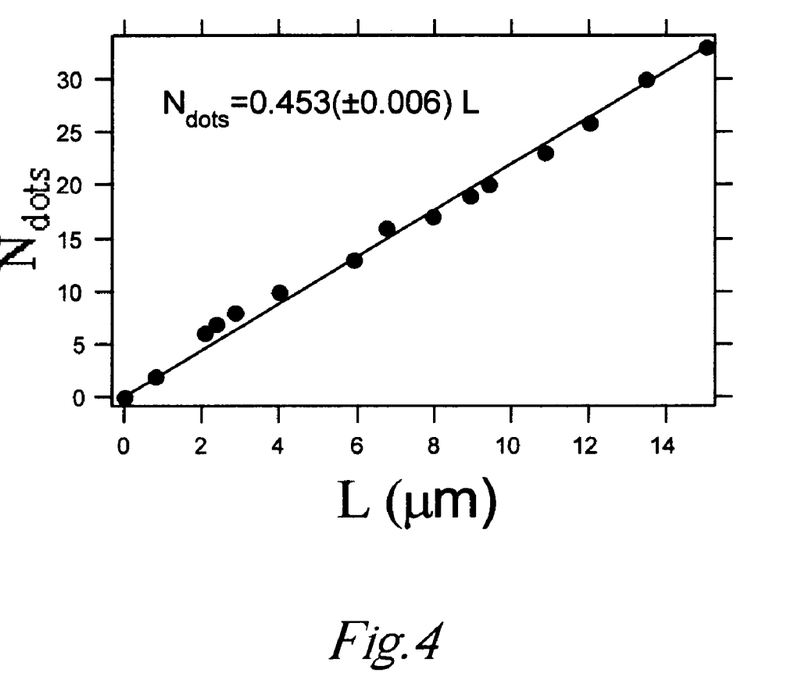
FIG. 4 shows the linear relationship between the number of dots and the scan length for a film of preset thickness.

In FIG. 4 the linear relationship between the number of dots and the scan length, for a film of preset thickness, as from FIG. 3b, is shown. The accuracy of the dot writing is better than 2%. Such value is estimated as follows:$N_{dots}$=aL, where a is the linear best fit of the whole data set shown in the plot in FIG. 4, setting the offset to zero. The best fit slope with its estimated r.m.s. is equal to 0.453±0.006 µm$^{-1}$ (for a 35 nm thick film). The value of the slope gives the characterictic length, else periodicity, and depends on the thickness of the film. Then, by using propagation of errors, the uncertainty on the number of structures is clculated as $\Delta N = \Delta a L + a \Delta L$. The second term is negligible because of the ansatz of linear regression theory, and the bit uncertainty (18 in this case) of the D/A converter. Therefore, $\Delta N/N = \Delta a/a = 1.32 < 2\%$.

Figure 5:
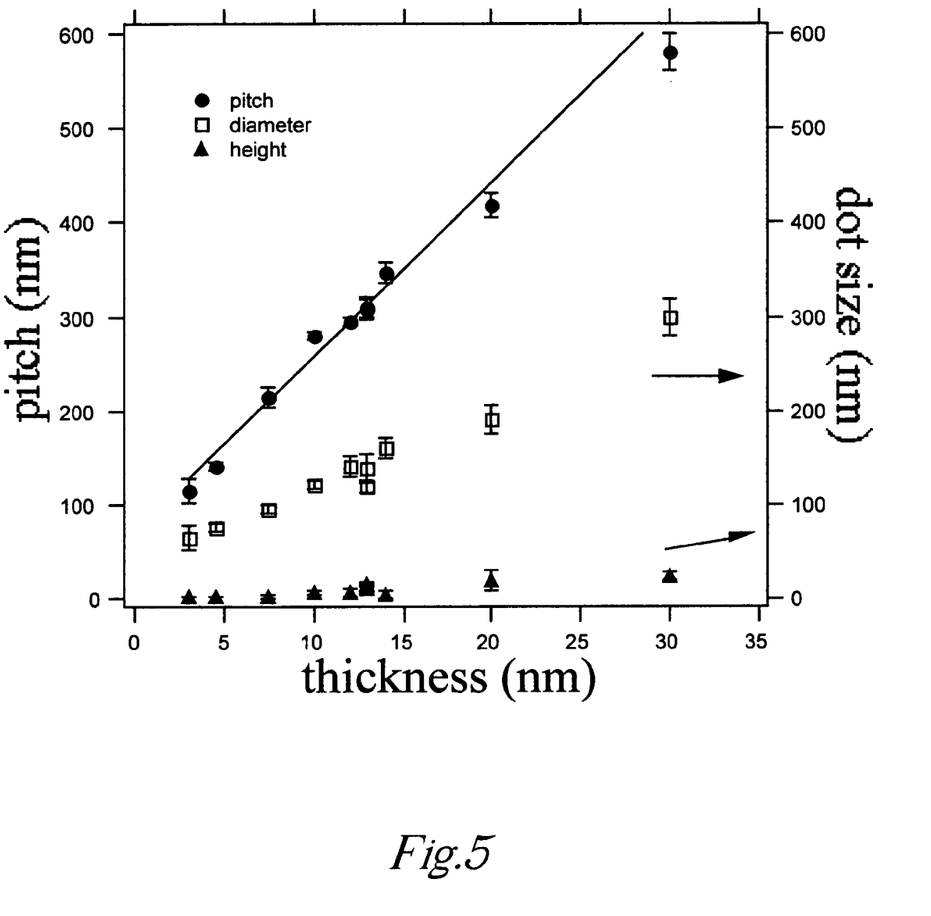
FIG. 5 shows the value of inter-dot spacing (left axis), the dot diameter and height (right axis) versus film thickness.

In FIG. 5, we show the values of the inter-dot spacing (left axis), the dot diameter and height (right axis) versus film thickness. By varying the film thickness in the range between 3 and 35 nm, inter-dot distance increases from 100 to 500 nm, the dot full-width-half-maximum from 40 to 250 nm, the dot height with respect to the smooth film from 1 to 20 nm, with a dispersion of 10-20%. The thicker the film the more spaced and larger are the dots. The linear dependence on the scan length and on film thickness allows one to store information as strings of bits whose number is easily controlled.

Pitch P, diameter R and height h, with respect to the unperturbed film, can then be described solely as a function of film thickness, D: $P = \alpha D$; $R = \beta D$; $h = \gamma D$.

The thinnest films ('nm) yield dots whose apparent FWHM is 40 nm, the actual diameter is R=20 nm (from comparison with SEM images), h=1.5 nm, and P=110 nm. The estimated error on statistical samples of about 100 dots is 10-20%. A value for P of 110 nm corresponds to an areal density large than 60 Gbpsi. Extrapolation to 1 nm, viz. the thickness of a monolayer, allows us to estimate the minimum pitch to be 70-80 nm, and hence an areal density of 80-100 Gbpsi.

DESCRIPTION OF THE STATIC PROCESS

The mechanical perturbation that provides the energy needed for the re-organisation of the film into dots can also be applied by means of a stamp.

Figure 6:
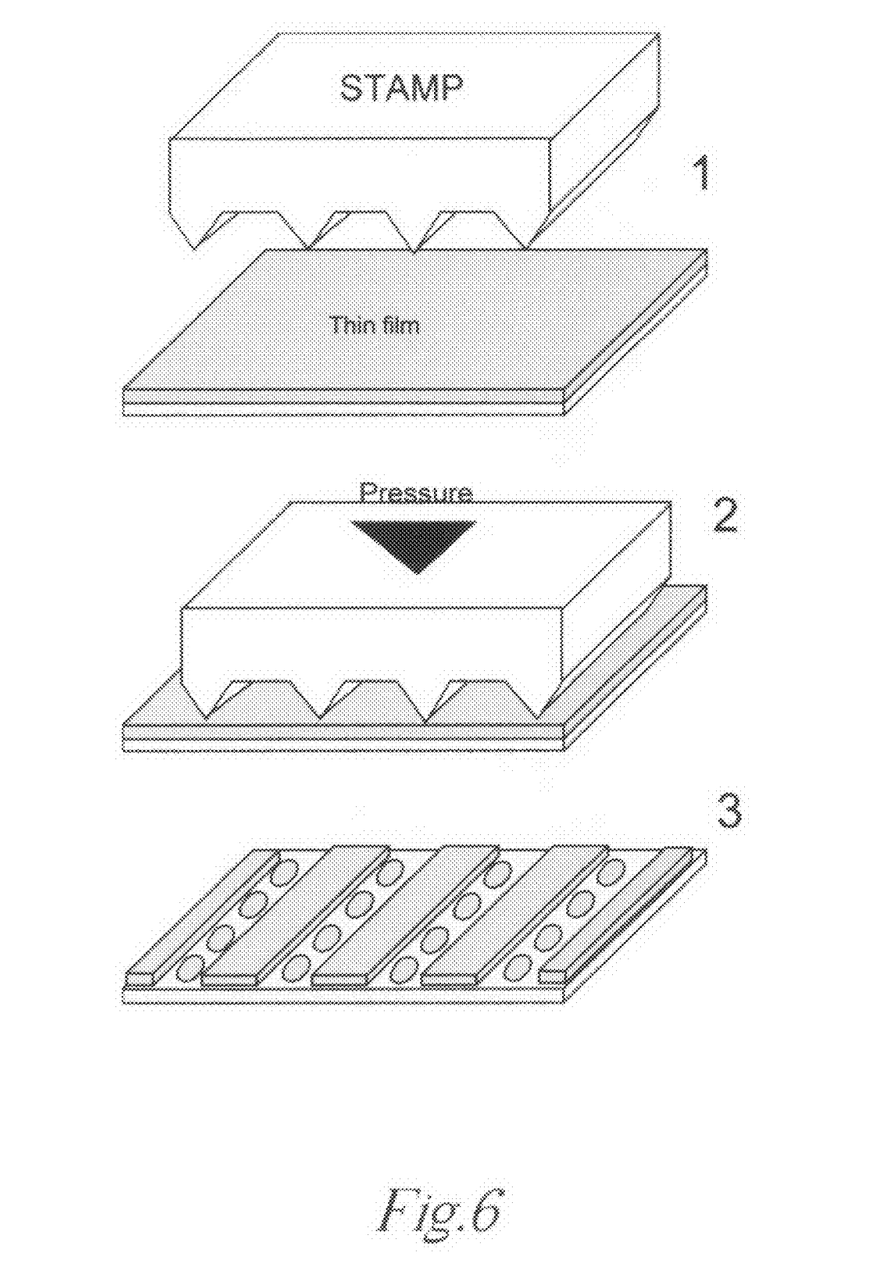
FIG. 6 shows a schematic illustration of the static process of the present invention.
Figure 7:
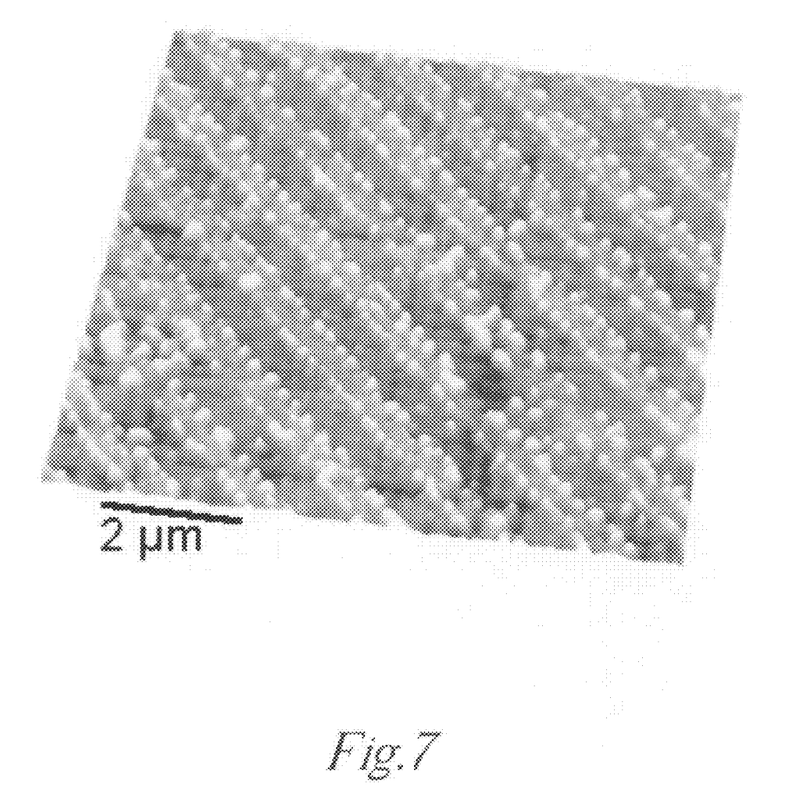
FIG. 7 shows an ATM image result of the morphological re-organization following the static process.

The process is schematically depicted in FIG. 6. The stamp is placed in contact with the thin film of rotaxanes, and then a suitable pressure (order of 1 kg/cm²) is applied. The process takes a few seconds, and the printing time depends of the stamp's material, the size of the motifs, the film thickness, and of the particular rotaxane used. The writing velocity with the static method depends also on the size of the stamp's protrusions. transformation is suitable for a new type of parallel lithography based on a stamp as a multiple source of mechanical perturbation. In FIG. 7, the AFM image shows the result of the morphological re-organisation following the static process. There, the process is applied to a thin film of rotaxane 1 deposited on graphite. The stamp consists of a sequence of parallel lines 400 nm wide and 100 nm high, coated with a thin Au film. The applied pressure upon contact is 2.5 kg/cm2. The result is that, in correspondance of the protrusions, viz. the region where the intimate contact with the thin film is realised, the film undergoes the morphological change into linear sequences of dots, and along all lines where the stamp was in contact with the thin film.

Thus, by fabricating suitable stamps with protrusions of different length (e.g. a DVD), one can generate sequences with variable numbers of dots along each protrusion's line, according to the individual lengths. This is an effective way to modulate the content of information across a large area, and at the same time to fabricate smaller nanostructures, viz. the dots, using a featureless coarser instrument, viz. the protrusion.

The application of the static method allows one to transfer in a few seconds the entire information contained in a disk, e.g. a DVD, but with a resolution potentially on the order of 100 nm. With a one-squared inch stamp patterned with a density comparable to that of a DVD, viz. about 5 Gbpsi, and a printing time of 5-10 seconds, writing speed for non volatile memories of 0.1-1 Gbit/s could be reached. This figure of merit is superior to that of any existing technology for non-volatile, non magnetic memories nowadays.

The re-organisation process has been observed and controlled, both in the static and dynamical cases, with the rotaxanes only, but not with their individual components, macrocycle or thread. Also, a variety of other molecules prepared in the form of a thin film have not exhibited any of such re-organisation phenomena upon external stimuli. The occurrence of the collective re-organisation is the consequence of a wetting/dewetting transistion that is triggered by the perturbation. Such a transition exhibits a phenomenology similar to spinodal dewetting, but follows different thickness-dependence, possibly due to the viscoelastic characteristics of the material. Additional experimental evidence and modelling, both not reported here, show clearly that:

i) the rotaxane thin film is initially amorphous;
ii) a perturbation, that can be either mechanical or thermal, provides the energy for molecules to form crystalline nuclei of nanometer size. Such nuclei expose already the most stable surface to the substrate. The detailed basal plane may depend on the nature of the substrate, but is usually chosen among a group of quasi-degenerate low-Miller indices planes of the rotaxane crystals, in order to minimise tension and/or promote commensurate growth where the substrate is crystalline such as graphite. The nuclei formation is possibly eased by mobility of rotaxanes or simply their internal degrees of freedom on the surface. It is estimated that energy barriers for rotation of macrocycle in the solid state are smaller (~0.3 eV) than the packing energy (2-3 eV), so circumrotation can occur without massive displacement of molecules until the minimum energy with the nearby molecules is achieved.
iii) the nuclei grow by ripening, incorporating smaller nearby nuclei that form within a cut-off distance, forming large crystallites. This process introduce spatial correlations that eventually will manifest in the pitch;

as the crystallites reach a critical size, and they are approximately at the same distance, the ripening process stops. The dots may grow even a bit further by incorporation of individual rotaxane molecules diffusing along the lines excited by the perturbation. The energy provided by the perturbation is not enough to complete the crystallisation process, and the system reaches a steady state. The strings of dots represent an intermediate, metastable step towards the full crystallisation into large crystals with no long-range spatial correlations. In general, and beyond rotaxanes, a material that can possesses the following characteristics:

can be prepared in an initial amorphous or short-range ordered film;
has limited adhesion with the substrate;
the components (atoms or molecules) have good surface diffusivity even if their energy is below a temperature of melting; they must not be mobile at room temperature;
it has a tendency to crystallise as energy is provided;

it may in principle be suitable to give rise to similar controllable phenomena.

Examples may be for instance gold on quartz or glass with no adhesion layer; conjugated oligomers on polar substrates.

The process of present invention allows to obtain a minimum demonstrated periodicity of the dots of 100 nm, and a minimum apparent width 20-40 nm.

The process of the present invention allows to the writing of information shown on areas as large as tens thousands micrometers$^2$, due exclusively to instrumental limits.

The process is also demonstrated to be scalable, and to be able to achieve, at least, areal densities in the range 100 GBits/in$^2$ (Gbpsi).

The present invention can be a viable route for storing non volatile information on an unexpensive soft medium, whose figures of merit are better than those of the current non-magnetic technology (CD, DVD, RVD), including technology not-yet on the market. The costs of the process and the materials are extremely low, and the energy consumption during the process is very modest.

The field of application of the present invention is information storage media. The main sectors of application are a) backup systems, b) consumer electronics. As a comparison, the Blue Ray optical disk (like DVD technology, but with a blue laser instead of a red one), developed by a consortium of nine large companies of consumer electronics, reaches a density of 15-20 Gbpsi. The main competitors of Blue Ray technology are holographic techniques, heavily protected by patents owned by IBM. However, the latter have not been proved stable enough at room temperature (RT).

Other potential applications of the present invention are: flash memories for mobile phones, disposable logic circuits and devices; identification media and markers for tagging and security; sensors of mechanical force, or temperature, or chemicals; photo-sensitive thin films; adaptive, self-cleaning, biomicking, functional surfaces; masks for patterning; gratings for photonics. Other sectors where the invention will be potentially relevant are sensing and diagnostics; coatings and thin films; tribology; microelectronics processing; photonics.

The disclosure in Italian Patent Application No. BO2002A000759 from which this application claims priority are incorporated herein by reference.

REFERENCES

1 Advanced Magnetic Storage and Medical Application http://www.jst.go.jp/EN/chiiki/0715en/contents/2000_akita.htm
2 Sandhu et al., U.S. Pat. No. 6,358,756 Mar. 19, 2002 "Self-aligned, magnetoresistive random-access memory (MRAM) structure utilizing a spacer containment scheme"
3 Zhou et al. U.S. Pat. No. 6,222,755; Apr. 24, 2001 "Solid state holographic memory"
4 Hua et al. U.S. Pat. No. 6,214,431 Apr. 10, 2001 "Optical data storage materials for blue-light DVD-R"
5 R. Garcia, M. Calleja, and H. Roher, J. Appl. Phys. 86, 1898 (1999).
6 B. W. Chui, H. J. Mamin, B. D. Terris, T. D. Stowe, D. Rugar, and T. W. Kenny, *Appl. Phys. Lett.* 69, 2767 (1996).
7 B. W. Chui, T. D. Stowe, Y. S. Ju, K. E. Goodson, T. W. Kenny, H. J. Mamin, B. D. Terris, R. P. Ried, and D. Rugar, *J. Microelectromech. Syst.* 7, 69 (1998);
8 P. Ried, H. J. Mamin, B. D. Terris, L. S. Fan, and D. Rugar, *J. Microelectromech. Syst.* 6, 294 (1997).
9 Drechsler U, Burer N, Despont M, et al. Microelectron eng. 67-8, 397-404, (2003)
10 Binnig et al., U.S. Pat. No. 5,835,477 Nov. 10, 1998 "Mass Storage Application of Local Probe Arrays"
11 Eleftheriou E, Antonakopoulos T, Binnig G K, et al. IEEE T MAGN 39 (2): 938-945, (2003).
12 Vettiger P, Cross G, Despont M, et al., IEEE T NANOTECHNOL 1 (1): 39-55, (2002).
13 E. B. Cooper, S. R. Manalis, H. Fang, H. Dai, K. Matsumoto, S. C. Minne, T. Hunt, and C. F. Quate, Appl. Phys. Lett. 75, 3566 (1999).
14 Massimiliano Cavallini, Paolo Mei, Fabio Biscarini Ricardo Garcia, "Parallel Writing by Local Oxidation Nanolithography with sub-Micrometer Resolution" Applied Physics Letters 2003
15 Cavallini, Biscarini, Mei and Garcia, Italian Patent BO2003A000614: "Procedimento su larga area per l'ossidazione locale del silicio e/o altri materiali mediante stampaggio su scale micro-e nanometriche"
16 Book "*Mechanically-Linked Macromolecules*" G J Clarkson & D A Leigh in "*Emerging Themes in Polymer Science*", Ed. A J Ryan, Royal Society of Chemistry, Cambridge, pp 299-306 (2001)

The invention claimed is:

1. A process for forming nanostructures comprising the step of applying on localised regions of a smooth thin film of rotaxanes or catenanes an external mechanical perturbation with preset magnitude thereby said film undergoes a collective morphological transformation and nanostructures are formed by selforganisation of said molecules, said nanostructures having preset number, size, interspacing and shape.

2. A process according to claim 1, wherein said nanostructures are in the form of dots when said regions are one-dimensional and said nanostructures are in the form of strips when said regions are two-dimensional.

3. A process according to claim 2, wherein said dots are formed with a density, inter-dot distance or pitch and size controlled by presetting a thickness of said thin film.

4. A process according to claim 2, wherein said dots are formed in a number controlled by presetting a length of said regions.

5. A process according to claim 2, wherein said dots are formed and used to code and store information with areal densities of 1-1000 Gbpsi.

6. A process according to claim 1, wherein the nanostructures are organised in the form of arrays of nanostructures.

7. A process according to claim 1, wherein said perturbation is applied with a scanning probe microscope (SPM).

8. A process according to claim 1, wherein the perturbation is applied with mechanical devices, millipedes or actuators able to produce multiple local perturbations.

9. A process according to claim 1, wherein said perturbation is applied with a rigid stamp or with a flexible stamp with which a load force is applied on said film regions, said load force being in the range of 0.1 to 100 kg/cm$^2$.

10. A process according to claim 1, wherein said morphological transformation of said thin film is obtained by wetting/dewetting transition, dewetting introducing spatial correlation.

11. A process according to claim 10, wherein said morphological transformation of said film is obtained by spinodal dewetting, crystallisation or formation of intermediate metastable structures.

12. A process according to claim 1, wherein said molecules are selected from the group consisting of rotaxanes, rotaxanes terminated with optically/electrically active groups and conjugated stoppers.

13. A process according to claim 12, wherein said rataxane is rotaxane 3.

14. A process according to claim 1, wherein said molecules are selected from the class of catenanes.

15. A process according to claim 1, wherein said thin film is deposited on a substrate or is grown on a substrate form solution, or from vapour phase, or from reactive precursors, or by sublimation.

16. A process for forming nanostructures comprising the step of applying on localised regions of a smooth thin film of rotaxanes or catenanes an external perturbation with preset magnitude thereby said film undergoes a collective morphological transformation and nanostructures are formed by selforganisation of said molecules, said nanostructures having preset number, size, interspacing and shape, the external perturbation being a mechanical perturbation applied with a scanning probe microscope (SPM) or with mechanical devices, millipedes or actuators able to produce multiple local perturbations.

* * * * *